US011672138B2

(12) United States Patent
Kim

(10) Patent No.: US 11,672,138 B2
(45) Date of Patent: Jun. 6, 2023

(54) ORGANIC LIGHT-EMITTING DISPLAY APPARATUS

(71) Applicant: Samsung Display Co., Ltd., Yongin-si (KR)

(72) Inventor: Moongon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 86 days.

(21) Appl. No.: 17/463,295

(22) Filed: Aug. 31, 2021

(65) Prior Publication Data

US 2021/0391555 A1    Dec. 16, 2021

Related U.S. Application Data

(63) Continuation of application No. 16/993,771, filed on Aug. 14, 2020, now Pat. No. 11,108,010, which is a continuation of application No. 16/442,387, filed on Jun. 14, 2019, now Pat. No. 10,749,137, which is a continuation of application No. 15/973,402, filed on May 7, 2018, now Pat. No. 10,326,099, which is a continuation of application No. 15/628,557, filed on Jun. 20, 2017, now Pat. No. 9,966,558, which is a continuation of application No. 14/884,610, filed on Oct. 15, 2015, now Pat. No. 9,685,626.

(30) Foreign Application Priority Data

Mar. 27, 2015    (KR) .................. 10-2015-0043297

(51) Int. Cl.
*H10K 50/84*    (2023.01)
*H01L 51/52*    (2006.01)
*H01L 27/32*    (2006.01)

(52) U.S. Cl.
CPC ...... *H01L 51/5237* (2013.01); *H01L 51/5256* (2013.01); *H01L 27/3276* (2013.01)

(58) Field of Classification Search
CPC ............. H01L 51/5237; H01L 51/5256; H01L 27/3276; H01L 27/3246; H01L 27/3258; H01L 51/5253; H01L 27/3248; H01L 27/3262
See application file for complete search history.

(56) References Cited

U.S. PATENT DOCUMENTS

| 8,895,982 | B2 | 11/2014 | Kim et al. |
| 9,054,059 | B2 | 6/2015 | Kim et al. |
| 9,343,699 | B2 | 5/2016 | Kwak |

(Continued)

FOREIGN PATENT DOCUMENTS

| JP | 2005-148478 A | 6/2005 |
| JP | 2012-003989 A | 1/2012 |

(Continued)

*Primary Examiner* — Kyoung Lee
(74) *Attorney, Agent, or Firm* — Lewis Roca Rothgerber Christie LLP

(57) ABSTRACT

An organic light-emitting display apparatus includes: a substrate; a display unit on the substrate and including a display area and a non-display area outside of the display area; and a thin-film encapsulation layer that seals the display unit, wherein the non-display area includes a dam region located outside of the display area and a plurality of protrusions on at least a part of the display unit outside of the dam region.

14 Claims, 4 Drawing Sheets

(56) References Cited

U.S. PATENT DOCUMENTS

| | | |
|---|---|---|
| 9,966,558 B2 | 5/2018 | Kim |
| 10,326,099 B2 | 6/2019 | Kim |
| 10,749,137 B2 | 8/2020 | Kim |
| 2003/0164674 A1 | 9/2003 | Imamura |
| 2010/0157412 A1* | 6/2010 | Lee .................. G02F 1/167 |
| | | 445/25 |

FOREIGN PATENT DOCUMENTS

| | | |
|---|---|---|
| KR | 10-2009-0117148 A | 11/2009 |
| KR | 10-2014-0055529 A | 5/2014 |
| KR | 10-2014-0127630 | 11/2014 |
| KR | 10-2015-0025260 A | 3/2015 |

* cited by examiner

ORGANIC LIGHT-EMITTING DISPLAY APPARATUS

CROSS-REFERENCE TO RELATED APPLICATIONS

This application is a continuation of U.S. patent application Ser. No. 16/993,771, filed on Aug. 14, 2020, which is a continuation of U.S. patent application Ser. No. 16/442,387, filed on Jun. 14, 2019, now U.S. Pat. No. 10,749,137, which is a continuation of U.S. patent application Ser. No. 15/973,402, filed May 7, 2018, now U.S. Pat. No. 10,326,099, which is a continuation of U.S. patent application Ser. No. 15/628,557, filed Jun. 20, 2017, now U.S. Pat. No. 9,966,558, which is a continuation of U.S. patent application Ser. No. 14/884,610, filed Oct. 15, 2015, now U.S. Pat. No. 9,685,626, which claims priority to and the benefit of Korean Patent Application No. 10-2015-0043297, filed Mar. 27, 2015, the entire content of all of which is incorporated herein by reference.

BACKGROUND

1. Field

One or more example embodiments relate to an organic light-emitting display apparatus.

2. Description of the Related Art

An organic light-emitting display apparatus includes an organic light-emitting device including a hole injection electrode, an electron injection electrode, and an organic emission layer disposed therebetween, and is a self-emission type (or kind of) display apparatus in which holes injected from the hole injection electrode and electrons injected from the electron injection electrode combine in the organic emission layer to generate excitons that change from an excited state to a ground state to emit light.

Since the organic light-emitting display apparatus that is a self-emission display apparatus does not use a separate light source, the organic light-emitting display apparatus may be driven at a low voltage, may be light-weight, and may be thin. Furthermore, the organic light-emitting display apparatus is receiving attention as a next generation display apparatus owing to its high quality characteristics, such as a wide viewing angle, high contrast, and a quick response speed. However, since an organic light-emitting device is deteriorated due to penetration of external moisture or oxygen into the organic light-emitting device, external moisture or oxygen need to be blocked from penetrating into the organic light-emitting device.

SUMMARY

One or more example embodiments include an organic light-emitting display apparatus.

Additional aspects will be set forth in part in the description which follows and, in part, will be apparent from the description, or may be learned by practice of the presented embodiments.

According to one or more example embodiments, an organic light-emitting display apparatus includes: a substrate; a display unit on the substrate and including a display area and a non-display area outside of the display area; and a thin-film encapsulation layer that seals the display unit, wherein the non-display area includes a dam region located outside of the display area and a plurality of protrusions on at least a part of the display unit outside of the dam region.

The plurality of protrusions may form a uniform pattern.

The plurality of protrusions may be arranged in a plurality of rows and a plurality of columns.

The plurality of protrusions may surround the dam region.

A power supply wire may be located in the non-display area, and the dam region may overlap and contact at least an outer edge of the power supply wire.

The thin-film encapsulation layer may include at least one inorganic film and at least one organic film, wherein the at least one organic film may be located in the dam region.

The thin-film encapsulation layer may include a plurality of inorganic films and a plurality of organic films respectively located between the plurality of inorganic films, wherein the plurality of inorganic films may cover the plurality of protrusions.

The plurality of inorganic films may contact each other outside of the plurality of protrusions.

The display unit may include: a thin-film transistor; an organic light-emitting device electrically coupled to the thin-film transistor; a passivation film between the thin-film transistor and the organic light-emitting device; and a pixel defining film defining a pixel region of the organic light-emitting device, wherein the dam region and the plurality of protrusions may be formed of a same material as at least one selected from the passivation film and the pixel-defining film.

The dam region may include: a first layer formed of a same material as the passivation film; and a second layer on the first layer and formed of a same material as the pixel-defining film, and the plurality of protrusions may be formed of the same material as the pixel-defining film.

The thin-film transistor may include: an active layer; a gate electrode; a source electrode; and a drain electrode, wherein a gate insulating layer may be located between the active layer and the gate electrode, and an interlayer insulating film may be located between the gate electrode and the source and drain electrodes, and the gate insulating layer and the interlayer insulating film may extend to the non-display area.

The plurality of protrusions may be located on the interlayer insulating film.

The thin-film encapsulation layer may include at least one inorganic film, wherein the at least one inorganic film may contact the interlayer insulating film outside of the plurality of protrusions.

The at least one inorganic film may contact a top surface of the substrate through an edge portion of the interlayer insulating film.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
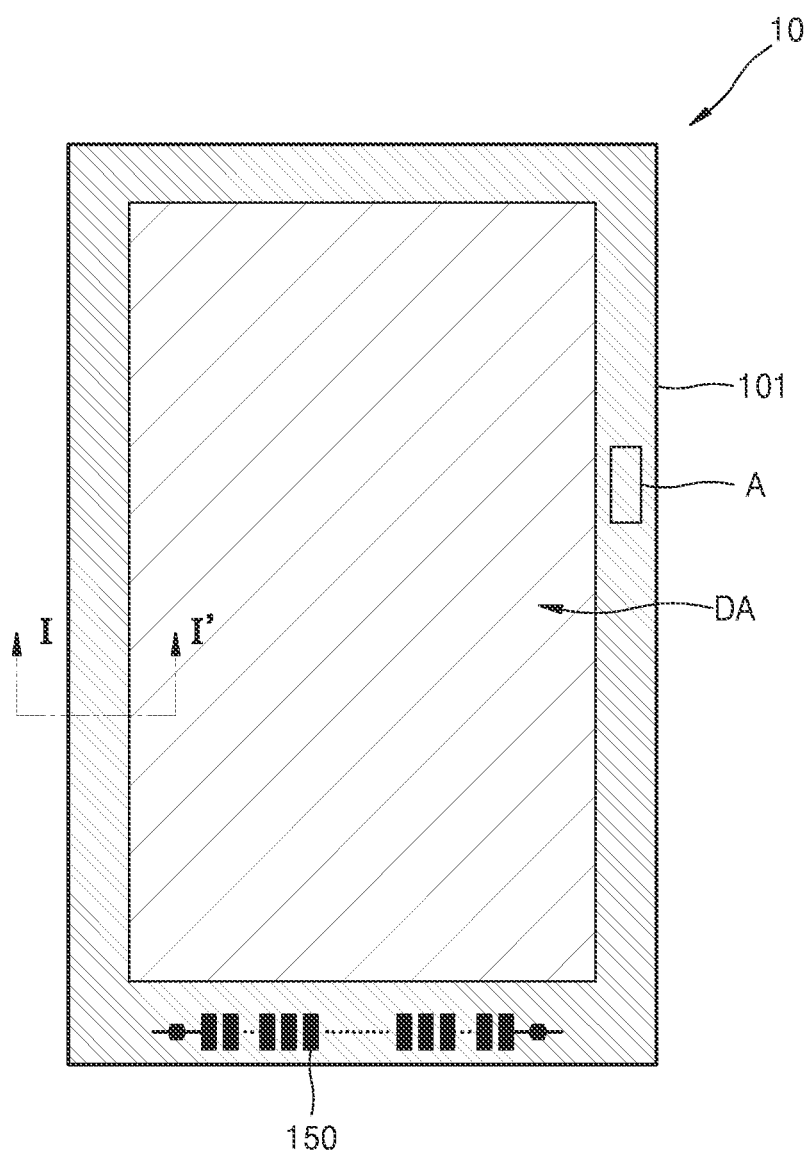
FIG. 1 is a plan view schematically illustrating an organic light-emitting display apparatus according to an example embodiment.

Reference will now be made in more detail to example embodiments, examples of which are illustrated in the accompanying drawings. In this regard, the present example embodiments may have different forms and should not be construed as being limited to the descriptions set forth herein. Accordingly, the example embodiments are merely described below, by referring to the figures, to explain aspects of embodiments of the present description. Also, while describing one or more example embodiments, detailed descriptions about related well-known functions or configurations that may diminish the clarity of the points of the one or more example embodiments are omitted.

It will be understood that although the terms "first", "second", etc. may be used herein to describe various components, these components should not be limited by these terms. These terms are only used to distinguish one component from another component.

Terms used herein are only used to describe one or more example embodiments, and are not intended to limit the one or more example embodiments. As used herein, the singular forms "a," "an" and "the" are intended to include the plural forms as well, unless the context clearly indicates otherwise. Sizes of elements in the drawings may be exaggerated for convenience of explanation. In other words, since sizes and thicknesses of components in the drawings may be arbitrarily illustrated for convenience of explanation, the following embodiments are not limited thereto.

It will be understood that when a layer, region, or component is referred to as being "formed on," "formed under," "coupled to," or "connected to" another layer, region, or component, it can be directly or indirectly formed on, formed under, coupled to, or connected to, respectively, the other layer, region, or component. That is, for example, intervening layers, regions, or components may be present.

As used herein, the term "and/or" includes any and all combinations of one or more of the associated listed items. Expressions such as "at least one of", when preceding a list of elements, modify the entire list of elements and do not modify the individual elements of the list.

Hereinafter, one or more example embodiments will be described below in more detail with reference to the accompanying drawings. Those components that are the same or that are in correspondence with one another are rendered or identified using the same reference numeral regardless of the figure number, and redundant explanations thereof are not provided.

Figure 2:
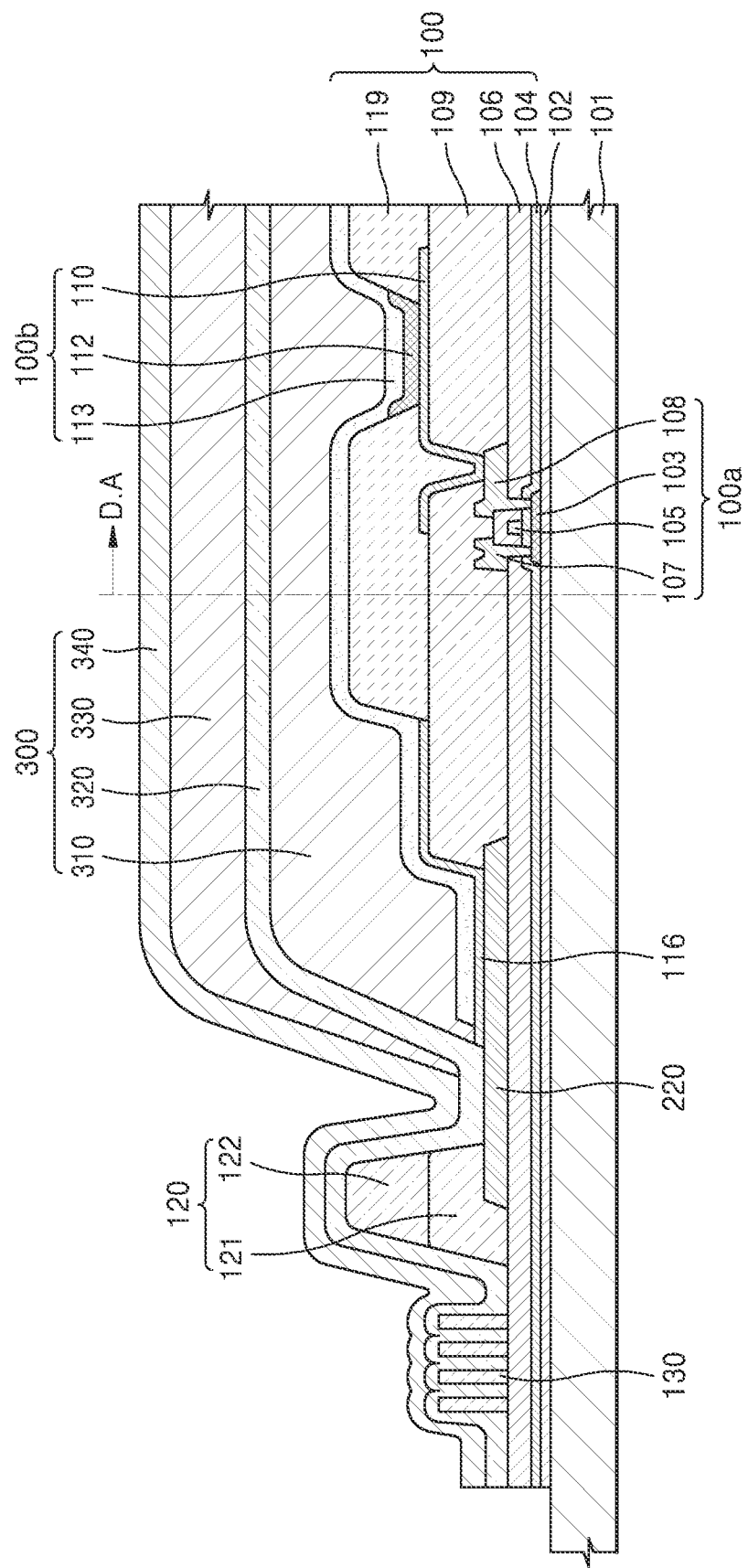
FIG. 2 is a cross-sectional view taken along a line I-I' of FIG. 1.
Figure 3:
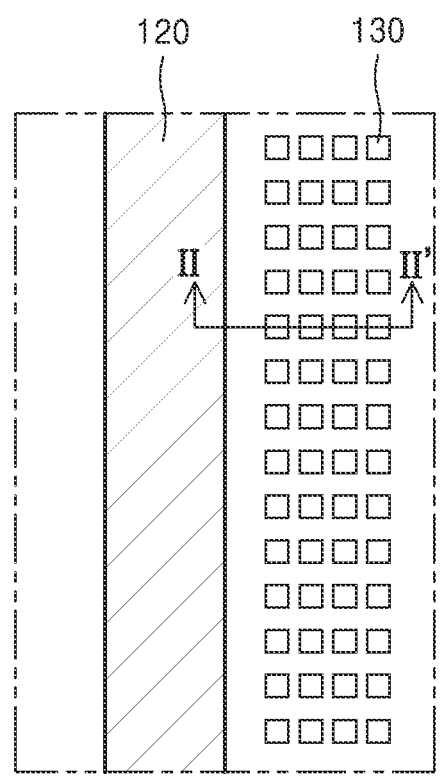
FIG. 3 is an enlarged view of a region A of FIG. 1.
Figure 4:
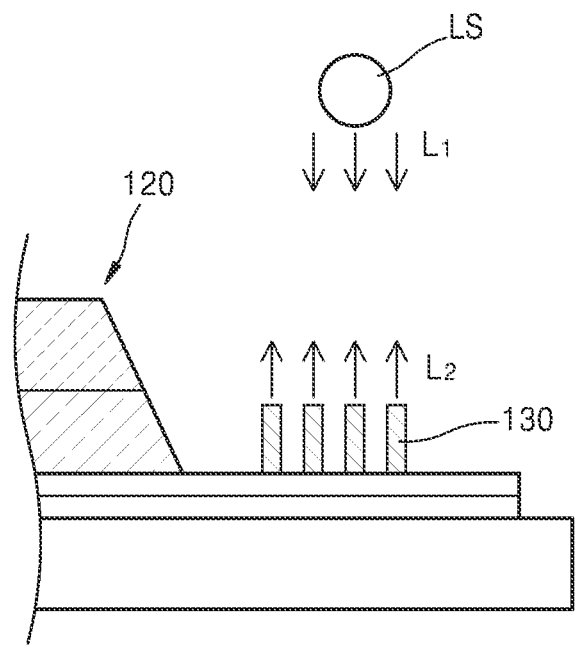
FIGS. 4 and 5 are cross-sectional views taken along a line II-II' of FIG. 3.
Figure 5:
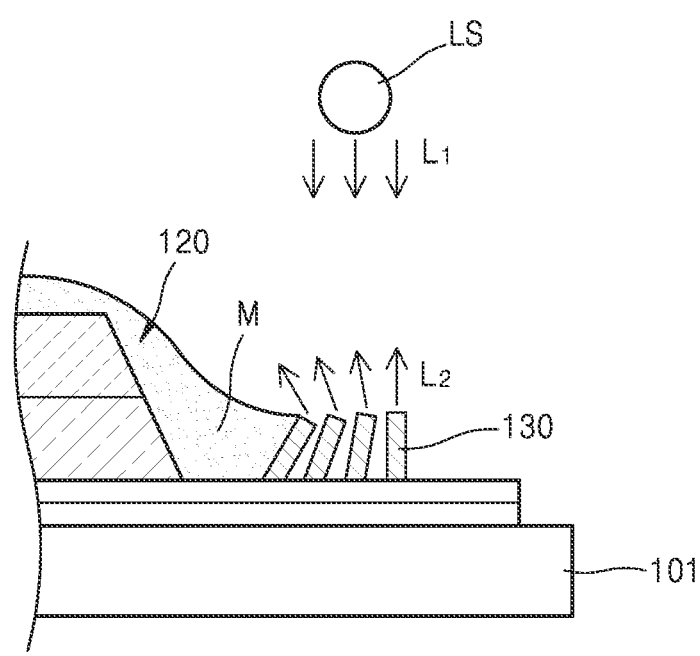

FIG. 1 is a plan view schematically illustrating an organic light-emitting display apparatus 10 according to an example embodiment, FIG. 2 is a cross-sectional view taken along a line I-I' of FIG. 1, FIG. 3 is an enlarged view of a region A of FIG. 1, and FIGS. 4 and 5 are cross-sectional views taken along a line II-II' of FIG. 3.

Referring to FIGS. 1 through 5, the organic light-emitting display apparatus 10 according to an example embodiment may include a substrate 101, a display unit 100 disposed on the substrate 101, and a thin-film encapsulation layer 300 sealing the display unit 100.

The substrate 101 may be formed of any one of various suitable materials. For example, the substrate 101 may be formed of a transparent glass material mainly including silicon oxide (e.g., $SiO_2$). However, a material of the substrate 101 is not limited thereto, and the substrate 101 may be formed of a transparent plastic material to be more flexible. The transparent plastic material may include an insulating organic material, such as polyethersulphone (PES), polyacrylate (PAR), polyetherimide (PEI), polyethylene naphthalate (PEN), polyethyleneterephthalate (PET), polyphenylene sulfide (PPS), polyarylate, polyimide, polycarbonate (PC), cellulose triacetate (TAC), or cellulose acetate propionate (CAP).

When the organic light-emitting display apparatus 10 is a bottom-emission type (or kind) wherein an image is realized in a direction toward the substrate 101, the substrate 101 is formed of a transparent material. However, when the organic light-emitting display apparatus 10 is a top-emission type (or kind) wherein an image is realized in a direction opposite to the substrate 101 (e.g., a direction away from the substrate 101), the substrate 101 may not necessarily be formed of a transparent material. In this case, the substrate 101 may be formed of, for example, a metal.

When the substrate 101 is formed of a metal, the substrate 101 may include at least one selected from iron, chromium, manganese, nickel, titanium, molybdenum, stainless steel (SUS), invar alloy, inconel alloy, and kovar alloy, but the substrate is not limited thereto.

The display unit 100 may be formed on the substrate 101. The display unit 100 may include a display area DA for realizing an image recognizable (viewable) by a user, and a non-display area outside of the display area DA. An organic light-emitting device 100b (shown in FIG. 2) may be disposed in the display area DA, and a power supply wire 220 supplying power to the organic light-emitting device 100b may be disposed in the non-display area. Also, a pad unit 150 transmitting an electric signal from a power supply device or a signal generating device to the display area DA may be disposed in the non-display area. The display unit 100 will now be described in more detail with reference to FIG. 2.

A buffer layer 102 may be formed on the substrate 101. The buffer layer 102 may provide a flat surface on the substrate 101, and prevent or reduce an impurity or moisture from penetrating through the substrate 101.

For example, the buffer layer 102 may contain or include an inorganic material, such as silicon oxide, silicon nitride, silicon oxynitride, aluminum oxide, aluminum nitride, titanium oxide, or titanium nitride; or an organic material, such as polyimide, polyester, or acryl; or may include a plurality of layers formed of or including the above-mentioned materials. The buffer layer 102 may be formed on the display area DA, and may extend to the non-display area.

A thin-film transistor 100a and the organic light-emitting device 100b electrically coupled or connected to the thin-film transistor 100a may be located in the display area DA.

The thin-film transistor 100a may include an active layer 103, a gate electrode 105, a source electrode 107, and a drain electrode 108.

Hereinafter, it is assumed that the thin-film transistor 100a is a top gate type (or kind) wherein the active layer 103, the gate electrode 105, the source electrode 107, and the drain electrode 108 are sequentially formed in the stated order. However, the present disclosure is not limited thereto, and the thin-film transistor 100a may be any suitable type (or kind), such as a bottom gate type (or kind).

In some embodiments, the active layer 103 is formed on the buffer layer 102. The active layer 103 may include a semiconductor material, such as amorphous silicon or polycrystalline silicon. However, the present disclosure is not limited thereto, and the active layer 103 may include any one of various suitable materials. According to an example embodiment, the active layer 103 may include an organic semiconductor material.

According to another example embodiment, the active layer 103 may include an oxide semiconductor material. For example, the active layer 103 may include an oxide of a material selected from among 12-, 13-, and 14-group metal elements (e.g., group 12, 13, and 14 metal elements of the periodic table of elements), such as, for example, selected from zinc (Zn), indium (In), gallium (Ga), tin (Sn), cadmium (Cd), and germanium (Ge), and a combination thereof.

A gate insulating layer 104 is formed on the active layer 103. The gate insulating layer 104 may include a single film or a plurality of films formed of an inorganic material, such as silicon oxide and/or silicon nitride.

The gate insulating layer 104 insulates the active layer 103 and the gate electrode 105 from each other. The gate insulating layer 104 may be formed or located not only in the display area DA, but may also be formed or located in a part of the non-display area.

The gate electrode 105 is formed on the gate insulating layer 104. The gate electrode 105 may be coupled or connected to a gate line that applies an on/off signal to the thin-film transistor 100a.

The gate electrode 105 may be formed of a low-resistance metal material. The gate electrode 105 may include a single layer or multiple layers (a plurality of layers) formed of, for example, at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Le), calcium (Ca), molybdenum (Mo), titanium (Ti), tungsten (W), and copper (Cu), considering adhesion of the gate electrode 105 to an adjacent layer, surface flatness of a stacked layer including the gate electrode 105, and processability.

An interlayer insulating film 106 is formed on the gate electrode 105. The interlayer insulating film 106 insulates the gate electrode 105 from the source and gate electrodes 107 and 108. The interlayer insulating film 106 may be formed or located not only in the display area DA, but may also be formed or located in a part of the non-display area.

The interlayer insulating film 106 may include a single film or multiple of films (a plurality of films) formed of inorganic material. For example, the inorganic material may be metal oxide or metal nitride. In more detail, examples of the inorganic material include silicon oxide ($SiO_2$), silicon nitride (SiNx; $1/2 \leq x \leq 4/3$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZrO_2$).

The source and drain electrodes 107 and 108 are formed on the interlayer insulating film 106. The source and drain electrodes 107 and 108 may each include a single layer or a multilayer (a plurality of layers) formed of at least one material selected from among Al, Pt, Pd, Ag, Mg, Au, Ni, Nd, Ir, Cr, Li, Ca, Mo, Ti, W, and Cu. The source and drain electrodes 107 and 108 are formed to contact (directly contact) a region of the active layer 103.

A passivation film 109 may be formed to cover the thin-film transistor 100a. The passivation film 109 removes a stepped portion formed by the thin-film transistor 100a and flattens a top surface of the thin-film transistor 100a (a top surface above the thin-film transistor 100a), thereby preventing or reducing a defect in the organic light-emitting device 100b caused by a lower unevenness (e.g., an unevenness due to the thin-film transistor 100a).

The passivation film 109 may include a single film or a plurality of films formed of an organic material. Examples of the organic material include polymethyl methacrylate (PMMA), general-purpose polymer such as polystyrene (PS), polymer derivatives having a phenol-based group, acryl-based polymer, imide-based polymer, aryl ether-based polymer, amide-based polymer, fluorine-based polymer, p-xylene-based polymer, vinyl alcohol-based polymer, and a blend thereof (e.g., a blend of any of the foregoing polymers). In some embodiments, the passivation film 109 may be a complex stacked structure of an inorganic insulating film and an organic insulating film.

The organic light-emitting device 100b is formed on the passivation film 109. The organic light-emitting device 100b is electrically coupled or connected to the thin-film transistor 100a, and includes a first electrode 110, a second electrode 113 facing the first electrode 110, and an intermediate layer 112 disposed between the first electrode 110 and the second electrode 113.

The first electrode 110 may be electrically coupled or connected to the gate electrode 108. The first electrode 110 may have any one of various suitable shapes. For example, the first electrode 110 may be patterned in island shapes (e.g., the first electrode may include a plurality of distinct islands that do not directly contact one another).

The first electrode 110 is formed on the passivation film 109, and may be electrically coupled or connected to the thin-film transistor 100a through a contact hole formed on the passivation film 109 (e.g., a contact hole passing through the passivation film 109). The first electrode 110 may be, for example, a reflective electrode. For example, the first electrode 110 may include a reflective film formed of Ag, Mg, Al, Pt, Pd, Au, Ni, Nd, Ir, Cr, or a compound thereof, and a transparent or semi-transparent electrode layer formed on the reflective film. The transparent or semi-transparent electrode layer may be formed of a material selected from indium tin oxide (ITO), indium zinc oxide (IZO), zinc oxide (ZnO), indium oxide ($In_2O_3$), indium gallium oxide (IGO), and aluminum zinc oxide (AZO).

The second electrode 113 facing the first electrode 110 may be a transparent or semi-transparent electrode, and may include a thin film formed of a metal having a low work function, such as Li, Ca, LiF/Ca, LiF/Al, Al, Ag, Mg, or a compound or a combination thereof. Also, an auxiliary electrode layer or a bus electrode may be further formed on the thin film by using a transparent electrode forming material, such as ITO, IZO, ZnO, or $In_2O_3$. Accordingly, the second electrode 113 may transmit light emitted from an organic emission layer included in the intermediate layer 112. For example, light emitted from the organic emission layer may be transmitted to the second electrode 113 directly or after being reflected at the first electrode 110, which may be a reflective electrode.

However, a type (or kind) of the display unit 100 according to example embodiments is not limited to a top emission type (or kind), and may be a bottom emission type (or kind) wherein light emitted from the organic emission layer is emitted towards the substrate 101. In this case, the first electrode 110 may be a transparent or semi-transparent electrode, and the second electrode 113 may be a reflective electrode. In some embodiments, the display unit 100 according to an example embodiment may be a dual emission type (or kind) wherein light is emitted in both top and bottom directions.

Meanwhile, a pixel-defining film 119 is formed on the first electrode 110 by using an insulating material. The pixel-defining film 119 may be formed of at least one organic insulating material selected from polyimide, polyamide, acryl resin, benzocyclobutene, and phenol resin, via a spin coating method. The pixel-defining film 119 exposes a certain region of the first electrode 110. The intermediate layer 112 including the organic emission layer is disposed in the certain region (e.g., in the exposed portion). In other words, the pixel-defining film 119 defines a pixel region of the organic light-emitting device 100b.

The organic emission layer included in the intermediate layer 112 may be formed of a low molecular organic material or a high molecular organic material (e.g., a low molecular weight organic material or a high molecular weight organic material), and the intermediate layer 112 may further include a functional layer, such as a hole transport layer (HTL), a hole injection layer (HIL), an electron transport layer (ETL), or an electron injection layer (EIL), as well as the organic emission layer.

A dam region 120 and a plurality of protrusions 130 may be located in the non-display area outside of the display area DA. In addition, the non-display area may include various suitable circuit patterns, such as the power supply wire 220 and a static electricity preventing pattern (e.g., a pattern that prevents or reduces generation of static electricity).

The power supply wire 220 includes a common voltage line ELVSS and a driving voltage line ELVDD, and may be formed of a same (substantially the same) material as the source and drain electrodes 107 and 108. In FIG. 2, the common voltage line ELVSS of the power supply wire 220 is illustrated, and the common voltage line ELVSS and the second electrode 113 are coupled or connected to each other through a wire 116, but the present disclosure is not limited thereto. For example, the common voltage line ELVSS and the second electrode 113 may be directly coupled or connected to each other.

The dam region 120 is disposed outside of the display area DA to prevent or reduce organic materials for forming organic films 310 and 330 of the thin-film encapsulation layer 300 from flowing towards an edge of the substrate 101 while forming the organic films 310 and 330, thereby preventing or reducing an edge tail of the organic films 310 and 330 from being formed. The dam region 120 may be formed to surround (partially or completely surround) the display area DA.

The dam region 120 may be formed of a same (substantially the same) material as at least one selected from the passivation film 109 and the pixel-defining film 119. For example, the dam region 120 may include a first layer 121 formed of the same (substantially the same) material as the passivation film 109, and a second layer 122 formed on the first layer 121 and formed of the same (substantially the same) material as the pixel-defining film 119. However, the present disclosure is not limited thereto, and the dam region 120 may include one layer (e.g., the dam region 120 may include a sole layer). Also, there may be a plurality of the dam regions 120. In this case, heights of the dam regions 120 may increase towards the outside of the substrate 101 (e.g., a height of a dam closer to an edge of the substrate 101 may be larger than a height of a dam further from the edge of the substrate 101).

The dam region 120 may overlap and contact (directly contact) at least a part of the power supply wire 220. For example, the dam region 120 may overlap and contact (directly contact) at least an outer edge of the power supply wire 220. The dam region 120 formed of the same (substantially the same) material as at least one selected from the passivation film 109 and the pixel-defining film 119 may have excellent bonding power (adhesion) to a metal. Accordingly, when the dam region 120 contacts the power supply wire 220 formed of a metal material, the dam region 120 may be stably formed with excellent bonding power (adhesion).

For example, in FIG. 2, the dam region 120 overlaps the outer edge of the power supply wire 220, but the present disclosure is not limited thereto. In some embodiments, the dam region 120 may be formed only on the power supply wire 220 or to cover the power supply wire 220.

The plurality of protrusions 130 may be formed on at least a part outside of the dam region 120. The protrusions 130 are located on the interlayer insulating film 106, and may be formed of the same (substantially the same) material as at least one selected from the passivation film 109 and the pixel-defining film 119.

The protrusions 130 may have a height lower than that of the dam region 120. For example, when the dam region 120 includes the first layer 121 formed of the same (substantially the same) material as the passivation film 109 and the second layer 122 formed on the first layer 121 and formed of the same (substantially the same) material as the pixel-defining film 119, the protrusions 130 may be formed of the same (substantially the same) material as the pixel-defining film 119.

The protrusions 130 may have a uniform (substantially uniform) pattern outside of the dam region 120. The protrusions 130 may be spaced apart from each other at regular (substantially regular) intervals. For example, the protrusions 130 may be disposed in a plurality of rows and a plurality of columns. The number of rows and columns of the protrusions 130 are not limited. However, as will be described below, the number of columns of the protrusions 130 may be at least three so as to recognize a pattern change of reflection light L2 reflected by the protrusions 130 (e.g., so that a change in a pattern of light L2 reflected by the protrusions 130 may be detected). The protrusions 130 may have any one of various suitable shapes, such as a pillar shape and/or a horn shape.

The protrusions 130 are used to easily recognize the organic material for forming the organic films 310 and 330 flowing outside of the substrate 101 over the dam region 120 (e.g., flow of the organic material for forming the organic films 310 and 330 over the dam region 120 may be detected by way of the protrusions 130). When the organic material for forming the organic films 310 and 330 flows outside of the substrate 101 over the dam region 120, edge tails of the organic films 310 and 330 may be formed. In this case, external moisture or oxygen may penetrate into the organic light-emitting display apparatus 10 through the edge tails, thereby causing a defect, such as a dark spot, in the organic light-emitting display apparatus 10.

FIGS. 4 and 5 are cross-sectional views taken along a line II-II' of FIG. 3, wherein in FIG. 4, an organic material M for forming the organic films 310 and 330 only exists on an inner region of the dam region 120 and in FIG. 5, the organic material M flows outside of the substrate 101 over the dam region 120.

As shown in FIG. 4, when flow of the organic material M is blocked by the dam region 120, shapes of the protrusions 130 outside of the dam region 120 remain intact (e.g., the position and/or shape of each of the protrusions 130 has not been changed or altered by the flow of the organic material). Accordingly, when light L1 is irradiated on or to the protrusions 130 from an external light source LS, the reflection light L2 reflected at the protrusions 130 having a uniform (substantially uniform) pattern may also have a uniform (substantially uniform) pattern.

However, as shown in FIG. 5, when the organic material M flows outside of the substrate 101 over the dam region 120, the shapes (and/or positions) of the protrusions 130 may be changed by the organic material M. For example, some of the protrusions 130 may be tilted or may fall in a direction towards the outside of the substrate 101 by the organic material M. When the shapes of the protrusions 130 are changed as such and the light L1 is irradiated from the light source LS, a reflection pattern of the reflection light L2 is changed by the protrusions 130. Thus, overflow of the organic material M may be easily identified (detected).

The protrusions 130 may be formed throughout and around the dam region 120. When the protrusions 130 are disposed to surround (partially or completely surround) the dam region 120, the overflow of the organic material M may be easily and quickly detected throughout and around the dam regions 120. In other words, since a defect may be easily determined while manufacturing the organic light-emitting display apparatus 10, a yield of the organic light-emitting display apparatus 10 may be increased.

Also, in some embodiments, the protrusions 130 have a concave-convex structure, and a first inorganic film 320 and a second inorganic film 340 of the thin-film encapsulation layer 300 may be formed to cover the protrusions 130 as will be described below. Accordingly, a penetration length of external moisture and oxygen may be increased.

The thin-film encapsulation layer 300 may seal the display unit 100 to prevent or reduce external oxygen and moisture from penetrating into the display unit 100. The thin-film encapsulation layer 300 may include the organic films 310 and 330 and the first and second inorganic films 320 and 340.

The organic films 310 and 330 and the first and second inorganic films 320 and 340 may be alternately stacked on each other to form a multilayer structure. In FIG. 2, the thin-film encapsulation layer 300 includes two organic films 310 and 330 and two first and second inorganic films 320 and 340, but the present disclosure is not limited thereto. For example, the thin-film encapsulation layer 300 may further include a plurality of inorganic encapsulation films and a plurality of organic encapsulation films, which are alternately disposed, wherein a number of times the inorganic encapsulation films and the organic encapsulation films are stacked on each other is not limited.

The organic films 310 and 330 may include at least one material selected from acryl-based resin, methacryl-based resin, polyisoprene, vinyl-based resin, epoxy-based resin, urethane-based resin, cellulose-based resin, and perylene-based resin.

Meanwhile, since the dam region 120 prevents or reduces the organic material M from flowing towards the edge of the substrate 101 while forming the organic films 310 and 330, the organic films 310 and 330 are located in (inside) the dam region 120.

The first and second inorganic films 320 and 340 may include at least one material selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first and second inorganic films 320 and 340 are formed to be larger than the organic films 310 and 330 and to cover the dam region 120 and the protrusions 130 that are concave and convex. Accordingly, a penetration length of external moisture and oxygen may be increased, thereby delaying, blocking, or reducing penetration of the external moisture and oxygen.

The first and second inorganic films 320 and 340 may extend outside of the protrusions 130, and may contact (directly contact) each other outside of the protrusions 130 (e.g., at least one of the first and second inorganic films 320 and 340 may directly contact at least one other of the first and second inorganic films 320 and 340 in a region outside of the protrusions 130). Also, at least one selected from the first and second inorganic films 320 and 340 may contact (directly contact) the interlayer insulating film 106 outside of the protrusions 130. Accordingly, bonding power (adhesion) of the thin-film encapsulation layer 300 may be increased and external moisture may be prevented or reduced from being permeated.

Also, at least one selected from the first and second inorganic films 320 and 340 may contact (directly contact) a top surface of the substrate 10 through an edge portion of the interlayer insulating film 106 outside of the protrusions 130, and may also contact (directly contact) side surfaces of the gate insulating layer 104 and interlayer insulating film 106. Accordingly, an encapsulation characteristic of the thin-film encapsulation layer 300 may be prevented or reduced from being weakened or removed due to detachment of edges of the first and second inorganic films 320 and 340.

According to an organic light-emitting display apparatus according to an example embodiment, penetration of external moisture or oxygen may be blocked or reduced by preventing or reducing an edge tail of an organic film of a thin-film encapsulation layer from being formed, and overflow of an organic material for forming an organic film may be easily determined.

While one or more example embodiments have been described with reference to the figures, it will be understood by those of ordinary skill in the art that various changes in form and details may be made therein without departing from the spirit and scope as defined by the following claims, and equivalents thereof.

What is claimed is:

1. An organic light-emitting display apparatus comprising:
   a substrate;
   a display area on the substrate and comprising an organic light-emitting device;
   a non-display area outside of the display area;
   a thin-film encapsulation layer over the display area, the thin-film encapsulation layer comprising a first inorganic layer, a first organic layer on the first inorganic layer, and a second inorganic layer on the first organic layer;
   a dam portion, in a plan view, located outside of the display area; and
   at least three protrusions, in the plan view, located outside of the dam portion,
   wherein,
   the first and second inorganic layers of the thin-film encapsulation layer cover the dam portion and the at least three protrusions, and
   the first and second inorganic layers of the thin-film encapsulation layer extend outside the at least three protrusions and contact each other outside of an outermost protrusion among the at least three protrusions.

2. The organic light-emitting display apparatus of claim 1, wherein the at least three protrusions are spaced apart from each other.

3. The organic light-emitting display apparatus of claim 1, wherein the dam portion surrounds the display area.

4. The organic light-emitting display apparatus of claim 1, further comprising:
   a thin-film transistor electrically coupled to the organic light-emitting device
   a passivation layer between the thin-film transistor and the organic light-emitting device; and a pixel-defining layer defining a pixel region of the organic light-emitting device, wherein the dam portion comprises a same material as at least one selected from the passivation layer and the pixel-defining layer.

5. The organic light-emitting display apparatus of claim 4, wherein, the dam portion comprises a first layer and a second layer on the first layer, and at least one selected from the first layer and the second layer comprises the same material as the passivation layer.

6. The organic light-emitting display apparatus of claim 4, wherein the thin-film transistor comprises:

an active layer;
a gate electrode;
a source electrode; and
a drain electrode,
wherein,
a gate insulating layer is between the active layer and the gate electrode,
an interlayer insulating layer is between the gate electrode and the source and drain electrodes, and
the gate insulating layer and the interlayer insulating layer extend outside of the at least three protrusions.

7. The organic light-emitting display apparatus of claim 6, wherein the first inorganic layer contacts the interlayer insulating layer outside of an outermost protrusion among the at least three protrusions.

8. The organic light-emitting display apparatus of claim 1, further comprising:

a power supply wire located in the non-display area, the power supply wire being electrically coupled to the organic light-emitting device, wherein a portion of the dam portion, in the plan view, overlaps the power supply wire.

9. The organic light-emitting display apparatus of claim 8, wherein a portion of the first inorganic layer of the thin-film encapsulation layer directly contacts an upper surface of the power supply wire.

10. The organic light-emitting display apparatus of claim 9, wherein a portion of the second inorganic layer of the thin-film encapsulation layer directly contacts the first inorganic layer in a region in which the first inorganic layer directly contacts the upper surface of the power supply wire.

11. The organic light-emitting display apparatus of claim 8, wherein the dam portion overlaps and contacts at least an outer edge of the power supply wire.

12. The organic light-emitting display apparatus of claim 8, wherein the organic light-emitting device comprises:

a first electrode;
a second electrode facing the first electrode; and
an intermediate layer between the first electrode and the second electrode, and
wherein a portion of the second electrode, in the plan view, overlaps the power supply wire.

13. The organic light-emitting display apparatus of claim 12, further comprising a wire between the power supply wire and the second electrode, wherein the power supply wire and the second electrode are electrically coupled to each other through the wire.

14. The organic light-emitting display apparatus of claim 13, wherein the wire comprises a same material as the first electrode.

* * * * *